(12) United States Patent
Kuge et al.

(10) Patent No.: US 6,414,891 B2
(45) Date of Patent: Jul. 2, 2002

(54) SEMICONDUCTOR DEVICE INCLUDING COMPLEMENTARY DATA BUS PAIR

(75) Inventors: Shigehiro Kuge; Takeshi Hamamoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/771,889

(22) Filed: Jan. 30, 2001

(30) Foreign Application Priority Data

Apr. 18, 2000 (JP) .................................. 2000-116659

(51) Int. Cl.[7] ................................................ G11C 7/00
(52) U.S. Cl. ................................... 365/205; 365/189.08
(58) Field of Search ............................ 365/205, 189.08

(56) References Cited

U.S. PATENT DOCUMENTS 5,260,904 A * 11/1993 Miyawaki et al. ...... 365/189.06
5,572,477 A   11/1996 Jung .......................... 365/221

FOREIGN PATENT DOCUMENTS

| JP | 0048985 | * | 4/1977 | ............ G11C/11/40 |
| JP | 7-272479 | | 10/1995 | |
| JP | 7-282582 | | 10/1995 | |

OTHER PUBLICATIONS

Betty Prince, "Semiconductor Memories", 1983, Wiley, 2nd pp. 312–314.*
"2000 IEEE International Solid–State Circuits Conference, Digest of Technical Papers vol. 43 ISSN 0193–6530", pp. 402–403 and 472–475, published on Feb. 7, 2000.

* cited by examiner

Primary Examiner—M. Tran
(74) Attorney, Agent, or Firm—McDermott, Will & Emery (57) ABSTRACT

A semiconductor memory device includes a pair of complementary data buses, capacitive element corresponding to an even-numbered address, an equalize circuit and amplifier, capacitive element corresponding to an odd-numbered address, and an equalize circuit and amplifier. The pair of complementary data buses continuously transfer even-numbered address data and odd-numbered address data read out from the memory cell array in an alternating manner. The equalize circuit corresponding to the odd-numbered address is operated when the amplifier corresponding to the even-numbered address operates whereas the equalize circuit corresponding to the even-numbered address is operated when the amplifier corresponding to the odd-numbered address operates.

6 Claims, 10 Drawing Sheets

SEMICONDUCTOR DEVICE INCLUDING COMPLEMENTARY DATA BUS PAIR

BACKGROUND OF THE INVENTION

1. Field of the Invention

The present invention relates to semiconductor devices, and particularly to a semiconductor device that transfers data using complementary data buses.

2. Description of the Background Art

A synchronous dynamic random access memory of a double data rate (DDR-SDRAM) is conventionally known as an example of a synchronous type semiconductor memory device. This semiconductor memory device reads out data in units of one column block each. More specifically, data of two bits (called even-numbered address data and odd-numbered address data) is read out by accessing the region whose least significant bit CA0 of the column address is 0 (region of an even-numbered address) and the region whose least significant bit CA0 of the column address is 1 (region of an odd-numbered address) at the same time.

These semiconductor memory devices employ the complementary data bus structure as the bus to transfer the data read out for the purpose of reducing power consumption and improving the speed.

Figure 8:
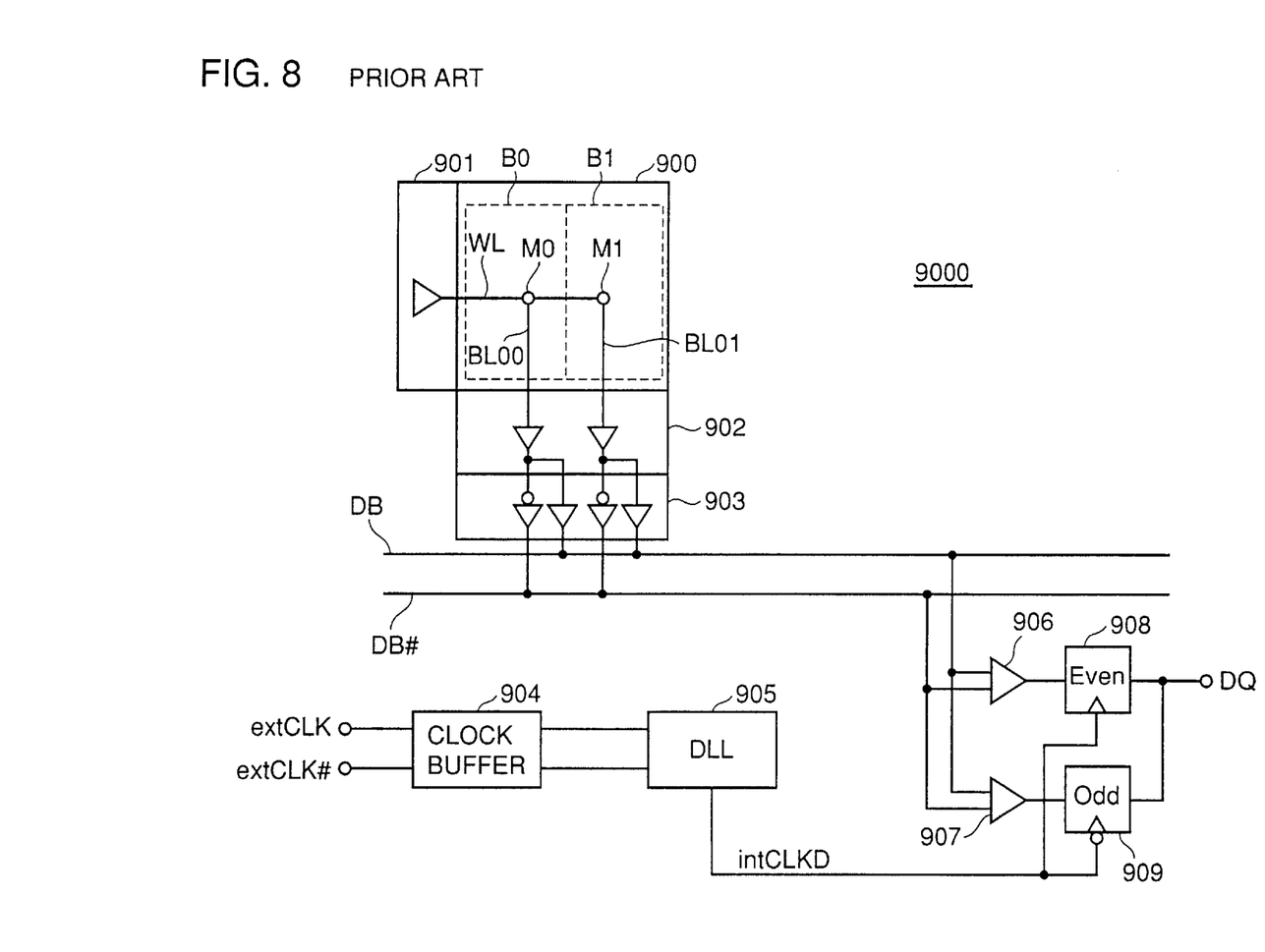
FIG. 8 is a schematic block diagram showing an entire structure of a conventional semiconductor memory device 9000.

A conventional semiconductor memory device will be described with reference to FIG. 8. Referring to FIG. 8, a semiconductor memory device 9000 includes a pair of complementary data buses DB, DB#, a memory cell array 900, a row related control circuit 901 performing a row select operation of memory cell array 900, a column related control circuit 902 performing a column select operation of memory cell array 900, a driver unit 903, a clock buffer 904 receiving external clocks extCLK and extCLK# complementary to each other, and an internal clock signal generation circuit (DLL: Delayed Locked Loop) 905 receiving the output of clock buffer 904 to generate an internal clock.

Memory cell array 900 includes a plurality of memory cells arranged in a matrix, a plurality of word lines arranged corresponding to a plurality of rows, and a plurality of bit lines arranged corresponding to a plurality of columns. Memory cell array 900 is divided into a block B0 of an even-numbered address, and a block B1 of an odd-numbered address. In the drawing, a word line WL, bit lines BL00, BL01, a memory cell M0 of block B0 connected to word line WL, and a memory cell M1 of block B1 connected to word line WL are depicted representatively. Even-numbered address data Even designates data read out from block B0 whereas odd-numbered address data Odd designates data read out from block B1.

Row related control circuit 901 renders a corresponding word line active according to an address signal. Column related control circuit 902 outputs the data on the selected bit line (readout data) according to an address signal.

Driver unit 903 receives readout data output from column related control circuit 902 to provide the readout data and data that is complementary to the readout data to data buses DB and DB#, respectively.

Semiconductor memory device 9000 further includes a receiver 906 to receive even-numbered address data Even from complementary data bus pair DB, DB#, a receiver 907 receiving odd-numbered address data Odd from complementary data bus pair DB, DB#, an output register 908 receiving and providing to a data input/output terminal DQ the output of receiver 906 according to an internal clock signal intCLKD output from internal clock signal generation circuit 905, and an output register 909 receiving and providing to data input/output terminal DQ the output of receiver 907 according to an inverted signal of internal clock signal intCLKD.

Figure 9:
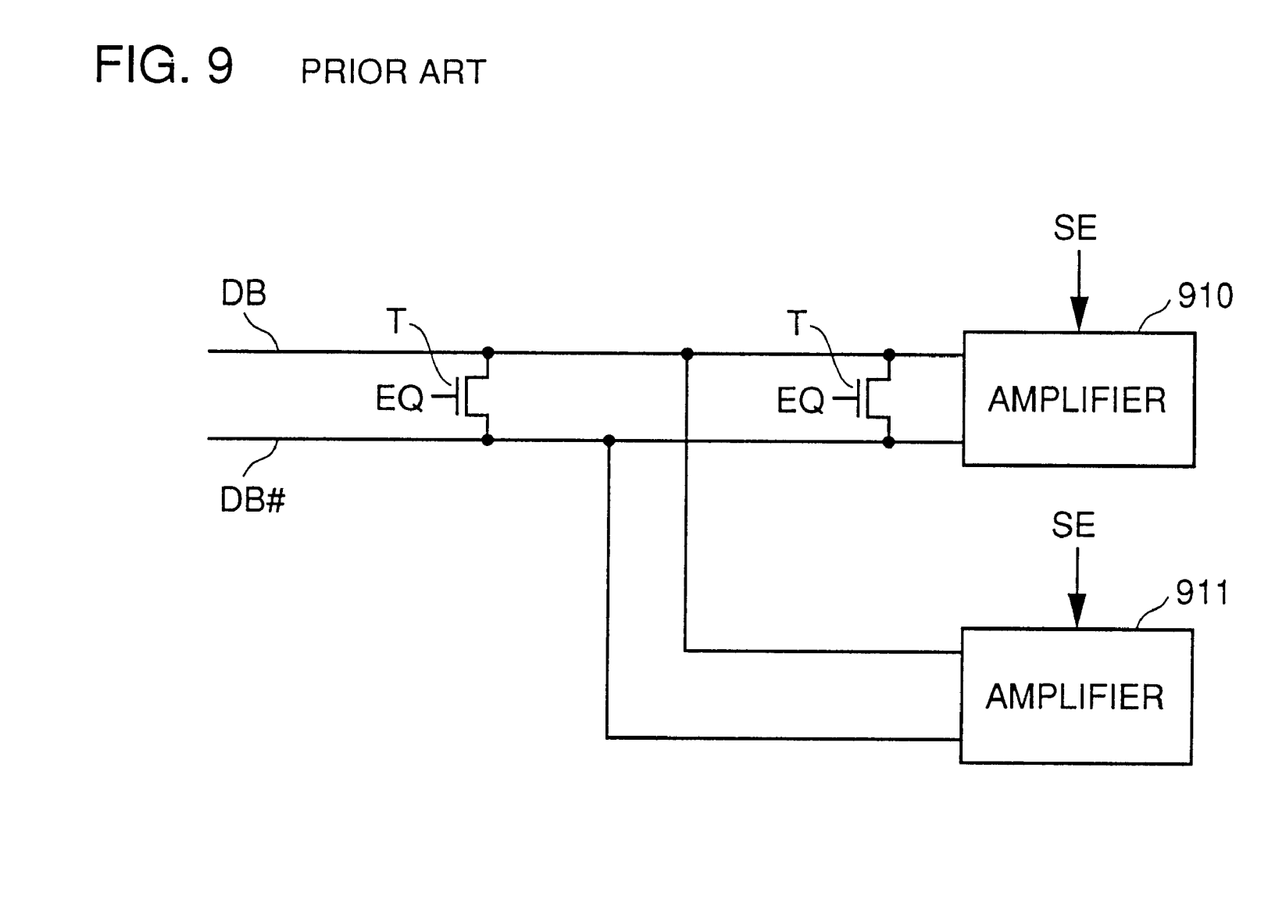
FIG. 9 is a schematic view of main components of conventional semiconductor memory device 9000.

The relationship between complementary data bus pair DB, DB# and the receivers of conventional semiconductor memory device 9000 will be described here with reference to FIG. 9.

An equalize circuit T to equalize data buses DB and DB# is located between data bus DB and data bus DB#. In FIG. 9, a transistor T connected between data bus DB and data bus DB# is depicted as an example of equalize circuit T.

Transistor T receives an equalize signal EQ at its gate. An equalize operation is executed when equalize signal EQ attains an H level, whereby data buses DB and DB# are electrically connected.

Receiver 906 includes an amplifier 910 for the even-numbered address. Amplifier 910 responds to an amplifier activation signal SE of an activated state to amplify the potential difference between data buses DB and DB# for output.

Receiver 907 includes an amplifier 911 for the odd-numbered address. Amplifier 911 responds to amplifier activation signal SE of an active state to amplify the potential difference between data buses DB and DB# for output.

Amplifier activation signal SE is opposite in phase to equalize signal EQ, and is rendered active during the period an equalize operation is suppressed.

Figure 10:
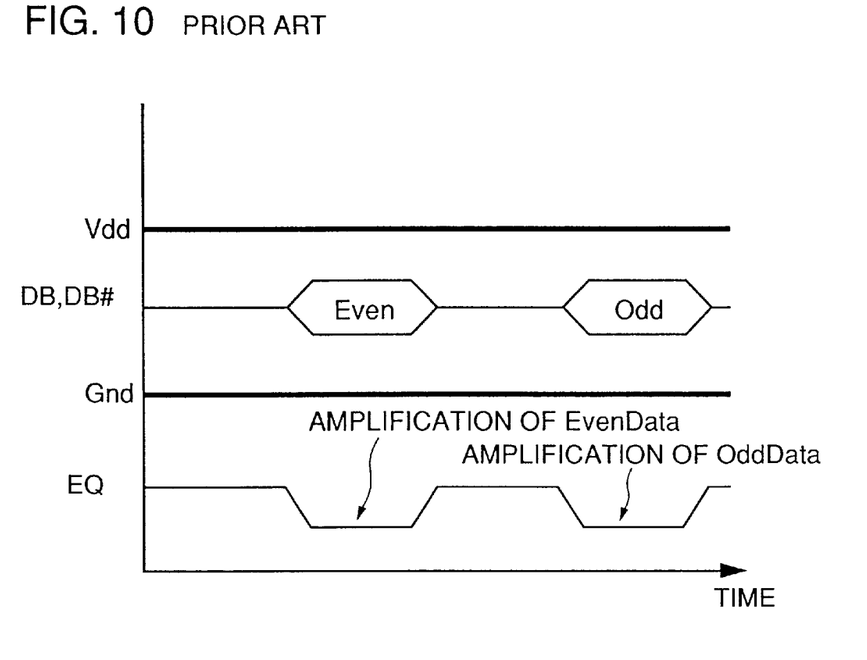
FIG. 10 is a timing chart to describe a data transfer operation of conventional semiconductor memory device 9000.

A readout operation of semiconductor memory device 9000 will be described with reference to FIG. 10. Equalize signal EQ is at an H level (active state). Data buses DB and DB# are equalized by the equalize circuit.

Even-numbered address data Even and odd-numbered address data Odd that are the subject of readout are selected. Then, equalize signal EQ is driven to an L level. First, even-numbered address data Even is transmitted onto complementary data bus pair DB, DB#. Amplifier activation signal SE attains an H level, whereby the potential difference between data buses DB and DB# is amplified in amplifier 910.

For the subsequent data transfer, equalize signal EQ is driven to an H level. The pair of complementary data buses DB, DB# are equalized.

Then, equalize signal EQ is pulled down to an L level. Odd-numbered address data Odd is transmitted onto complementary data bus pair DB, DB#. Amplifier activation signal SE is driven to an H level, whereby the potential difference between data buses DB and DB# is amplified in amplifier 911.

For the subsequent read/write operation, equalize signal EQ is driven to an H level again.

According to the above-described structure of conventional semiconductor memory device 9000, the complementary data bus pair must always be equalized after data is output to the complementary data bus pair in reading out data continuously.

Therefore, the time for equalization cannot be reduced. More specifically, there was a problem that the chip could not be operated at 143 MHz or above.

An approach can be considered to provide a complementary data bus pair corresponding to respective even-numbered address data and odd-numbered address data to solve this problem. However, the chip size will be increased with the above-described structure.

Furthermore, it is difficult to obtain data of sufficient amplitude at the reception side (receiver side) as the chip size is increased and the data bus becomes longer. This reduction in data amplitude prevents high speed operation.

SUMMARY OF THE INVENTION

In view of the foregoing, an object of the present invention is to provide a semiconductor device that can transfer data speedily and reliably.

According to an aspect of the present invention, a semiconductor device includes a memory cell array with a plurality of memory cells, a data bus pair of a first data bus and a second data bus transmitting data complementary to each other, a read circuit reading out n (n is an integer of at least 2) storage data out of a plurality of storage data stored in a plurality of memory cells and providing n storage data continuously to the data bus pair in a data readout operation, a plurality of output circuits provided corresponding to n storage data, respectively, each sensing potential difference between the first and second data buses to amplify the sensed potential difference for output, and a data transfer processing circuit arranged between the data bus pair and the plurality of output circuits for the plurality of output circuits to continuously receive corresponding storage data alternately.

Preferably, each of the plurality of output circuits includes a circuit amplifying the potential difference between a first node whose voltage level changes according to the potential of the first data bus and a second node whose voltage level changes according to the potential of the second data bus. The data transfer processing circuit includes a plurality of first capacitive elements arranged corresponding to the plurality of output circuits, respectively, each connected between the first data bus and a corresponding first node, a plurality of second capacitive elements arranged corresponding to the plurality of outputs circuits, respectively, each connected between the second data bus and a corresponding second node, and a plurality of equalize circuits provided corresponding to the plurality of output circuits, respectively, each connected between a corresponding first node and a corresponding second node. The plurality of equalize circuits equalize the corresponding first node and the corresponding second node continuously and alternately.

Further preferably, the equalize operation of a corresponding equalize circuit is suppressed when one of the plurality of output circuits performs differential amplification.

According to the above semiconductor device, an equalize period is not required between each data transfer when data is transferred continuously using a pair of complementary data buses. Therefore, data can be transferred at high speed.

By coupling the amplifier and the complementary data bus pair through a capacitor, the amplitude of the data on the data bus can be sensed to read the actual data. Therefore, storage data can be output reliably and continuously even when the data bus becomes longer.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

A semiconductor memory device according to an embodiment of the present invention will be described in detail with reference to the drawings. In the drawings, the same or corresponding components have the same reference characters allotted, and description thereof will not be repeated.

A semiconductor memory device 1000 according to an embodiment of the present invention is a double data rate synchronous dynamic random access memory including a pair of complementary data buses, configured to transfer data speedily using the pair of complementary data buses.

From the memory cell array in semiconductor memory device 1000, data corresponding to an even-numbered address (even-numbered address data Even) and data corresponding to an odd-numbered address (odd-numbered address data Odd) are read out simultaneously in units of one column block each.

Figure 1:
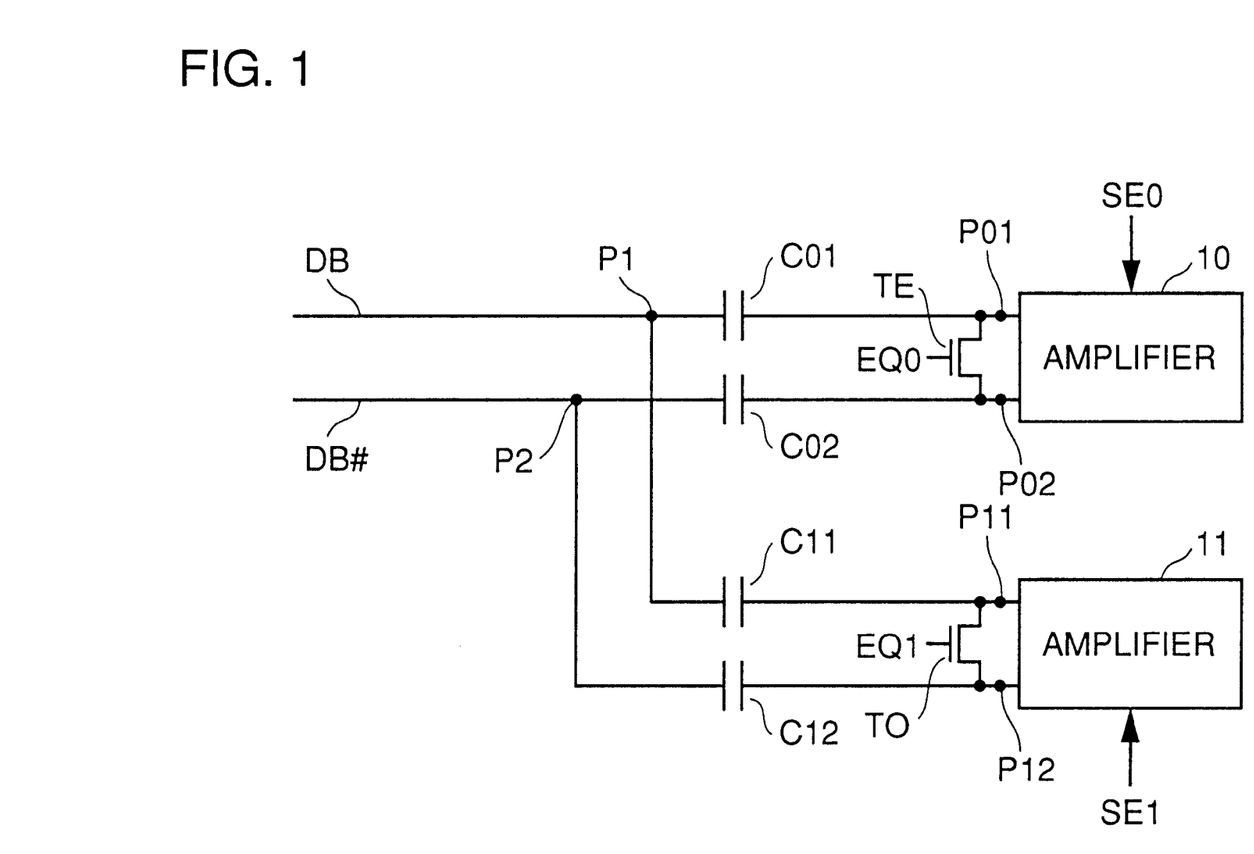
FIG. 1 is a schematic view of a structure of main components of a semiconductor memory device 1000 according to an embodiment of the present invention.

The data read out are transferred continuously through complementary data bus pair DB, DB#, as shown in FIG. 1. Data buses DB and DB# transfer data that are complementary to each other.

Complementary data bus pair DB, DB# are arranged with an amplifier 10 corresponding to the even-numbered address and an amplifier 11 corresponding to the odd-numbered address, respectively. The data on the data buses are detected by amplifiers 10 and 11.

Amplifier 10 is coupled with complementary data bus pair DB, DB# via capacitors. Amplifier 11 is coupled with complementary data bus pair DB, DB# via capacitors. Capacitive coupling is employed to detect the data on the data buses. Accordingly, the amplitude of the data on the data bus can be sensed to read the actual data.

More specifically, a capacitive element C01 is arranged between a node P1 and a node P01 on data bus DB. Also, a capacitive element C02 is arranged between a node P2 and a node P02 on data bus DB#. Amplifier 10 is rendered active according to a rise of an amplifier activation signal SE0 to amplify the potential difference between nodes P01 and P02.

Also, a capacitive element C11 is arranged between node P1 and a node P11 on data bus DB. A capacitive element C12 is arranged between node P2 and a node P12 on data bus DB#. Amplifier 11 is rendered active in response to a rise of an amplifier activation signal SE1 to amplify the potential difference between nodes P11 and P12.

Furthermore, an equalize circuit TE is arranged at the capacitive coupling node between capacitive element C01, C02 and amplifier 10. In the drawing, a transistor TE to provide electrical connection between nodes P01 and P02 is depicted as an example of equalize circuit TE.

Similarly, an equalize circuit TO is arranged at the capacitive coupling node between capacitive elements C11, C12 and amplifier 11. In the drawing, a transistor TO to provide electrical connection between nodes P11 and P12 is depicted as an example of equalize circuit TO.

Equalize circuit TE is rendered active (conductive) in response to an equalize signal EQ0 for an even-numbered address. Equalize circuit TO is rendered active (conductive) according to an equalize signal EQ1 for an odd-numbered address. Activation of equalize circuit TE causes nodes P01 and P02 to be equalized. Activation of equalize circuit TO causes nodes P11 and P12 to be equalized.

Figure 2:
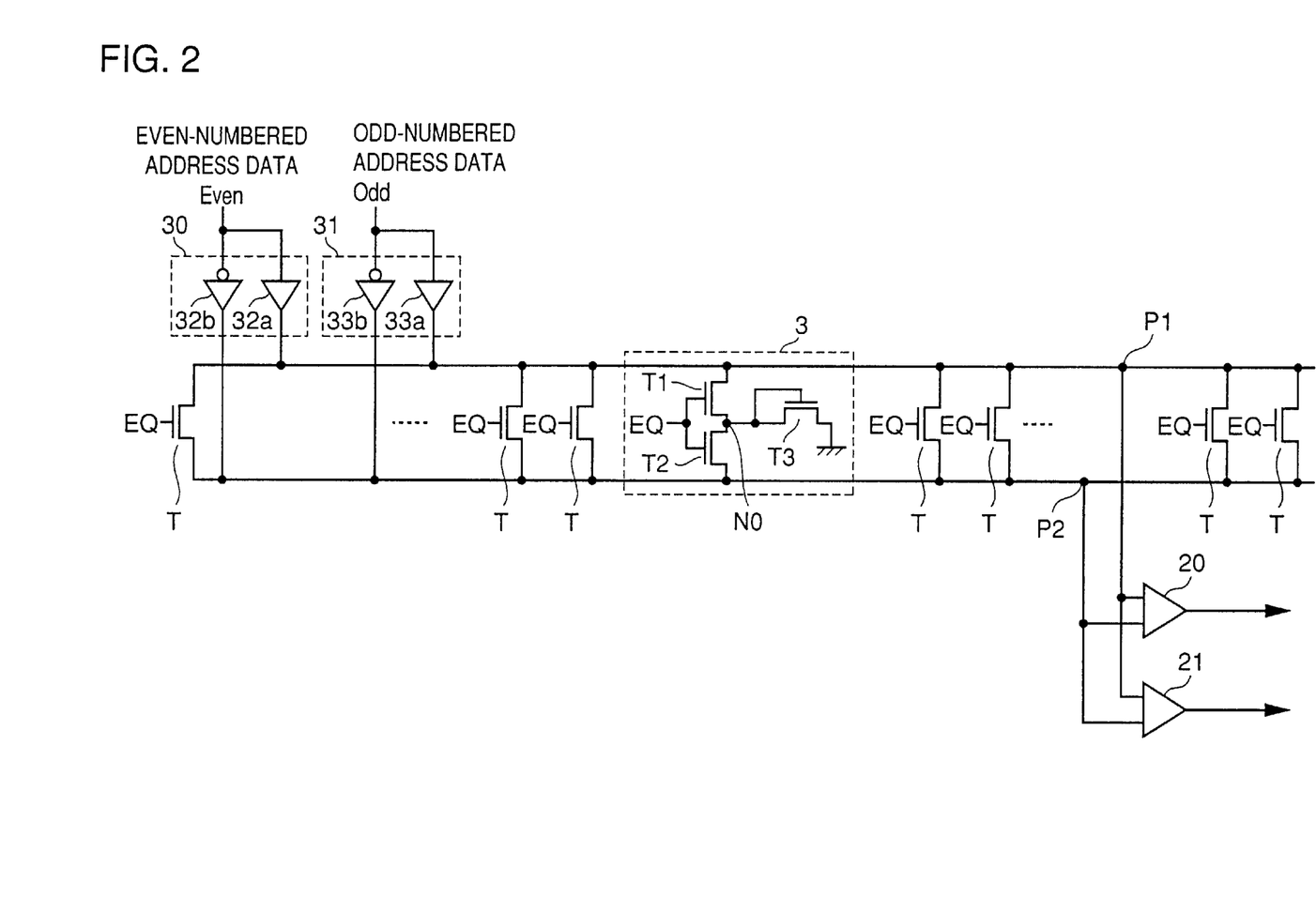
FIG. 2 shows a specific structure of main components of semiconductor memory device 1000.

A more specific structure is shown in FIG. 2. Referring to FIG. 2, a receiver 20 includes the above-described amplifier 10, capacitive elements CO1, CO2, and equalize circuit TE. A receiver 21 includes the above-described amplifier 11, capacitive elements C11, C12, and equalize circuit TO.

Equalize circuit (transistor) T arranged in a dispersed manner between data buses DB and DB# electrically connects data bus DB with data bus DB# according to equalize signal EQ of an active state (H level).

An equalize circuit 3 including transistors T1 and T2 and a diode (transistor) T3 is arranged in the proximity of the middle of complementary data bus pair DB, DB#. Equalize circuit 3 effects clamping with diode T3 to equalize the data buses at the potential of equalize signal EQ.

Transistors T1 and T2 have respective one conduction terminals connected to data buses DB and DB# and respective other conduction terminals connected to a node N0. Transistors T1 and T2 receive equalize signal EQ at their gates. Transistor T3 has its drain and gate connected to node N0, and its source connected to the node receiving ground potential. Diode T3 clamps the potential of node N0 at the level of the threshold voltage.

For example, an internal power supply voltage Vdd is set to approximately 2.1 V, and the threshold voltage Vth of transistor T3 is set to 0.75. In the system where node N0 is set to ½ Vdd, the gate-source voltage Vgs of transistors T1 and T2 becomes approximately 1.05 V.

In contrast, the gate-source voltage Vgs of transistors T1 and T2 become (2.1−0.75) V=1.35 V by equalize circuit 3. Therefore, the gate-source voltage Vgs can be increased than the case where the system sets node N0 to ½ Vdd.

Since the gate-source voltage Vgs can be achieved more easily by equalize circuit 3, transistors T1 and T2 can be turned on easily to facilitate equalization in the case where the voltage is reduced.

Driver 30 shown in FIG. 2 is a circuit to transmit even-numbered address data Even and data that is complementary to this data Even to complementary data bus pair DB, DB#, and includes a circuit 32a providing readout even-numbered address data Even to data bus DB, and a circuit 32b to invert even-numbered address data Even and provide the inverted data to data bus DB#.

Driver 31 is a circuit to transmit odd-numbered address data Odd and data that is complementary to data Odd to complementary data bus pair DB, DB#, and includes a circuit 33a to provide readout odd-numbered address data Odd to data bus DB, and a circuit 33b inverting odd-numbered address data Odd and providing the inverted data to data bus DB#.

Figure 3:
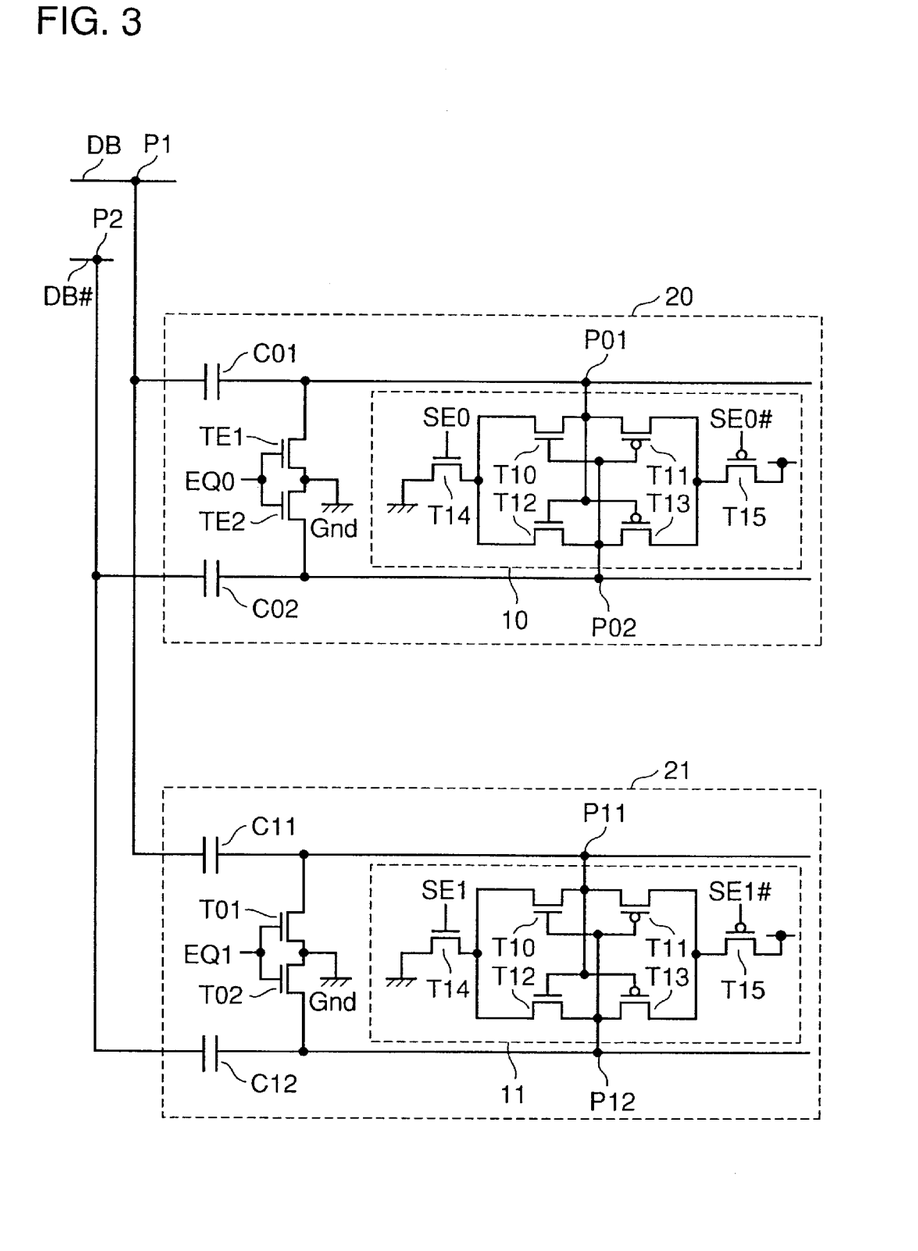
FIG. 3 shows an example of a specific structure of receivers 20 and 21.

A specific example of the structure of receivers 20 and 21 will be described here with reference to FIG. 3. Equalize circuit TE shown in FIG. 3 is formed of transistors TE1 and TE2. Transistor TE1 is connected between node P01 and a node Gnd receiving ground potential Gnd. Transistor TE2 is connected between node P02 and node Gnd. Transistors TE1 and TE2 receive equalize signal EQ0 at respective gates. Nodes P01 and P02 are set to the ground potential in response to equalize signal EQ0 of an H level.

Equalize circuit TO shown in FIG. 3 is formed of transistors TO1 and TO2. Transistor TO1 is connected between node P11 and node Gnd receiving ground potential Gnd. Transistor TO2 is connected between node P12 and node Gnd. Transistors TO1 and TO2 receive equalize signal EQ1 at respective gates. Nodes P11 and P12 are set to the ground potential in response to equalize signal EQ1 of an H level.

Amplifier 10 includes cross-coupled NMOS transistors T10 and T12 driving the lower potential side (nodes P01 or P02) of the complementary data bus pair to the level of the ground potential, cross-coupled PMOS transistors T11 and T13 driving the higher potential side (nodes P01 or P02) of the complementary data bus pair to the level of power supply potential, an NMOS transistor T14 arranged between the ground potential and transistors T10, T12, rendered conductive in response to amplifier activation signal SE0, and a PMOS transistor T15 arranged between the power supply potential and transistors T11, T13, rendered conductive in response to amplifier activation signal SE0#. Amplifier activation signal SE0 is opposite in phase to amplifier activation signal SE0#.

Similarly, amplifier 11 includes cross-coupled transistors T10 and T12 driving the lower potential side (nodes P11 or P12) of the complementary data bus pair to the level of the ground potential, cross-coupled transistors T11 and T13 driving the higher potential side (nodes P11 or P12) of the complementary data bus pair to the level of the power supply potential, transistor T14 arranged between the ground potential and transistors T10, T12, rendered conductive in response to amplifier activation signal SE1, and transistor T15 arranged between the power supply potential and transistors T11, T13, rendered conductive in response to amplifier activation signal SE1#. Amplifier activation signal SE1 is opposite in phase to amplifier activation signal SE1#.

Figure 4:
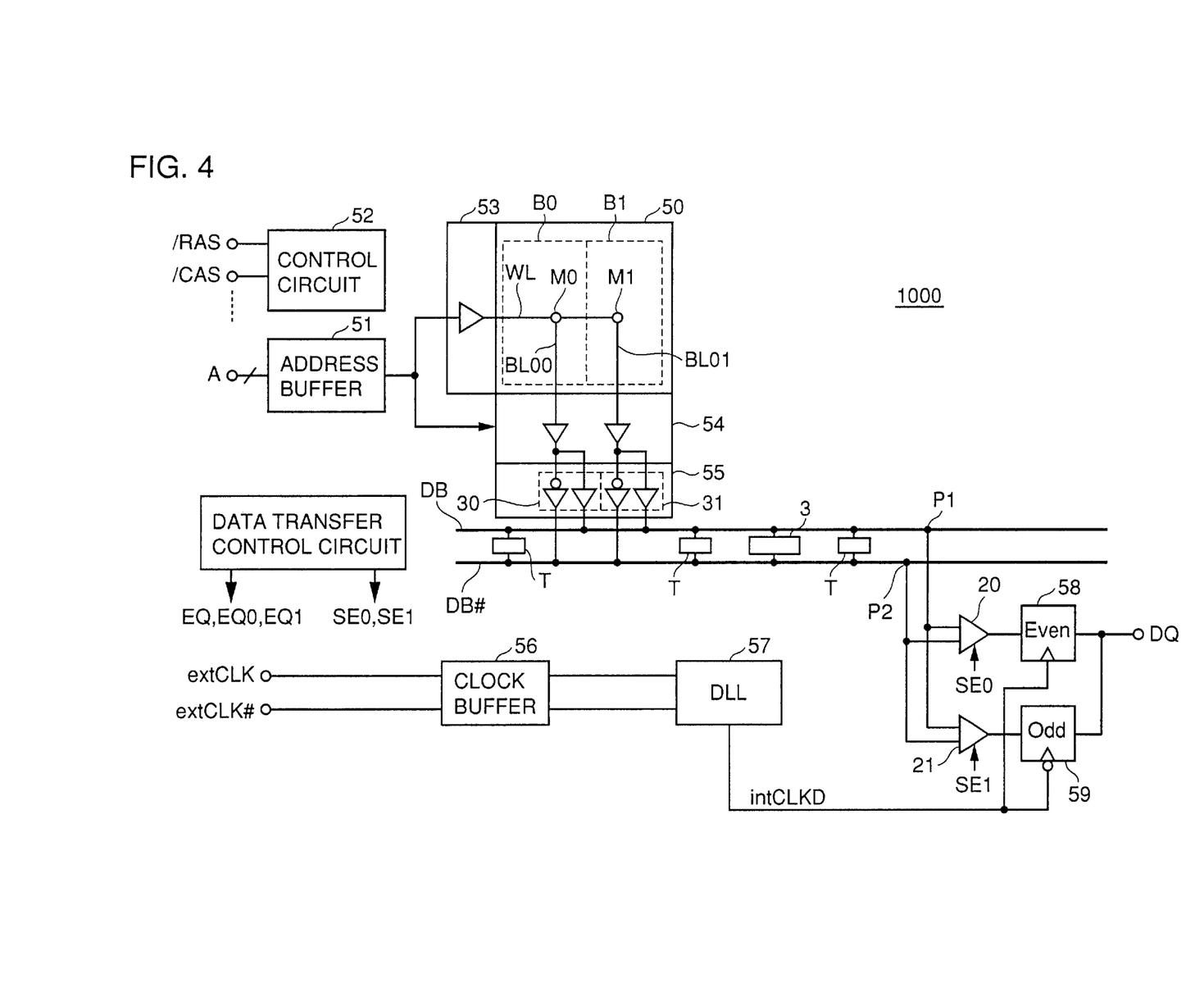
FIG. 4 is a schematic view of the entire structure of semiconductor memory device 1000.

The entire structure of semiconductor memory device 1000 of the present invention will be described schematically with reference to FIG. 4. Referring to FIG. 4, semiconductor memory device 1000 includes a memory cell array 50 with a plurality of memory cells arranged in a matrix, a plurality of word lines arranged corresponding to a plurality of rows, and a plurality of bit lines arranged corresponding to a plurality of columns, an address buffer 51 receiving an address signal A, a control circuit 52 decoding an external control signal and generating a signal to control the internal operation, and a row related control circuit 53 carrying out a row select operation of memory cell array 50 according to the row address output from address buffer 51 under control of control circuit 52.

Memory cell array 50 is divided into blocks B0 and B1. In the drawing, a word line WL, bit lines BL00, BL01, a memory cell M0 of block B0 connected to word line WL and bit line BL00, and a memory cell M1 of block B1 connected to word line WL and bit line BL01 are illustrated representatively. Block B0 is a region whose least significant bit CA0 of the column address is 0 (region of even-numbered address). Block B1 is a region whose least significant bit CA0 of the column address is 1 (region of odd-numbered address). Even-numbered address data Even corresponds to data read out from block B0. Odd-numbered address data Odd corresponds to data read out from block B1.

Control circuit 52 receives an external control signal such as an external row address signal/RAS, an external column address strobe signal/CAS, and the like in synchronization with an internal clock signal (a signal in synchronization with external clock signal) output from the internal clock signal generation circuit that will be described afterwards.

Semiconductor memory device 1000 further includes a column related control circuit 54 carrying out a column select operation of memory cell array 50 according to the column address output from address buffer 51 under control of control circuit 52, a driver unit 55 including the above-described drivers 30 and 31, a clock buffer 56 receiving external clocks extCLK and extCLK# complementary to each other, an internal clock signal generation circuit (DLL) 57 receiving the output of clock buffer 56 to generate an internal clock signal that determines the timing of the internal operation, receivers 20 and 21, an output register 58 for an even-numbered address to latch the data amplified differentially from receiver 20 and provide the latched data to data input/output terminal DQ, an output register 59 for an odd-numbered address to latch data amplified differentially from receiver 21 and provide the latched data to data input/output terminal DQ, and a data transfer control circuit 60 generating a signal required for the data transfer process using complementary data bus pair DB, DB#.

Column related control circuit 54 outputs the data (readout data) on the selected bit line according to a column address.

Driver unit 55 receives the readout data output from column related control circuit 54 to provide the readout data and data that is complementary to the readout data to data buses DB and DB#, respectively. Driver unit 55 transfers continuously the two storage data read out from blocks B0 and B1 alternately to the complementary data bus pair in synchronization with the internal clock signal output from internal clock signal generation circuit 57.

Output register 58 operates according to internal clock signal intCLKD output from internal clock signal generation circuit 57. Output register 59 operates according to an inverted signal of internal clock signal intCLKD. Accordingly, data of two bits will be output for every one clock.

Data transfer control circuit 60 drives equalize signals EQ, EQ0 and EQ1, and also amplifier activation signals SE0 and SE1 under control of control circuit 52.

Data transfer according to the embodiment of the present invention will be described with reference to FIGS. 5 and 6. In the drawings, EvenData and Even represent even-numbered address data whereas OddData and Odd represent odd-numbered address data.

Figure 5:
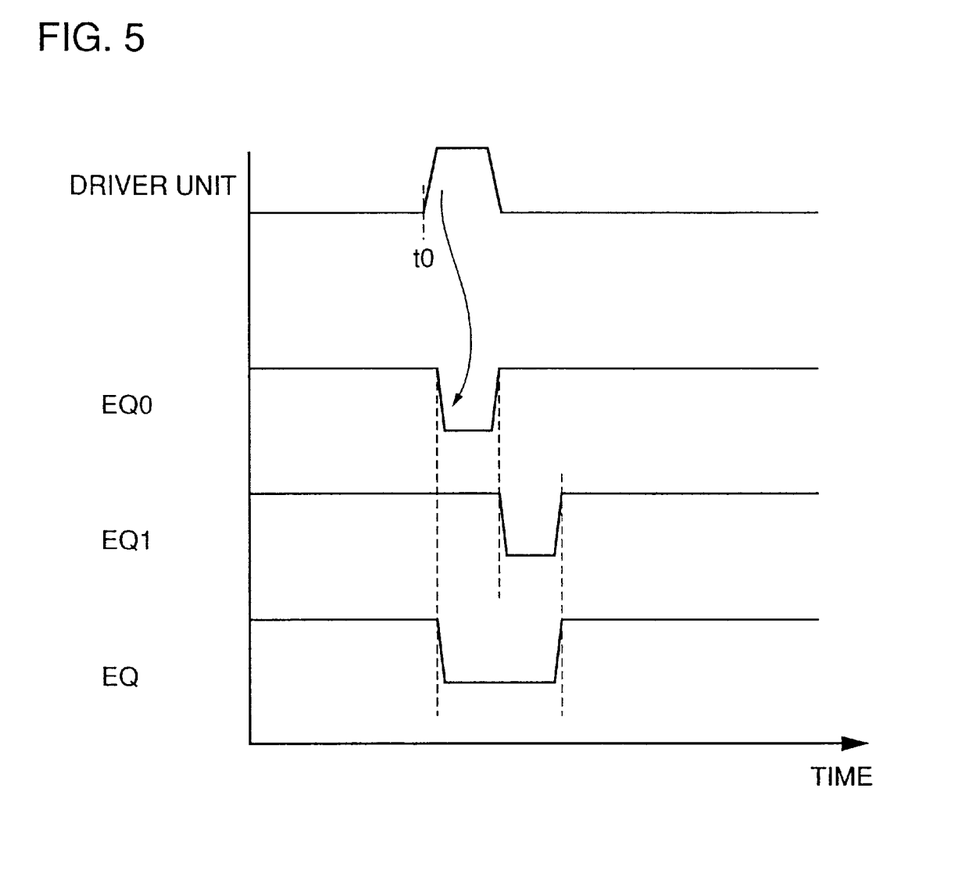
FIG. 5 is a timing chart to describe the equalize timing of data buses.

Referring to FIG. 5, all equalize signals are at the active state of an H level in the initial state. Complementary data bus pair DB, DB# are equalized, and the potentials of nodes P01, P02, P11 and P12 are at the level of the ground potential.

Driver unit 55 receiving data from column related control circuit 54 is rendered active at the data transfer timing of to. Data are transferred to the data buses by drivers 30 and 31.

At the time of activation of driver circuit 55, equalize signal EQ and equalize signal EQ0 corresponding to an even-numbered address are driven to an L level (inactive state).

At an elapse of a predetermined time, equalize signal EQ0 corresponding to the even-numbered address is pulled up again to the H level, and equalize signal EQ1 corresponding to the odd-numbered address is pulled down to an L level.

At an elapse of a predetermined time, equalize signal EQ and equalize signal EQl corresponding to the odd-numbered address are pulled up to the H level again.

Amplifier activation signal SE0 and equalize signal EQ0 are opposite in phase. Also, amplifier activation signal SE1 and equalize signal EQl are opposite in phase. Amplifier activation signal SE0 is rendered inactive (or active) at the time point of rendering equalize signal EQ0 active (or inactive). Also, amplifier activation signal SE1 is rendered inactive (or active) at the time of rendering equalize signal EQl active (or inactive).

Figure 6:
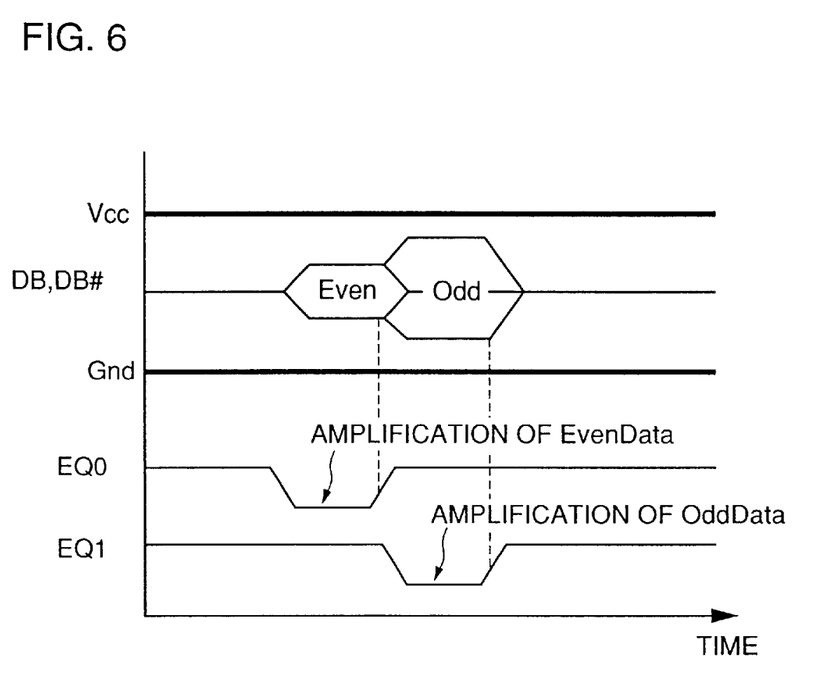
FIG. 6 is a timing chart to describe a data transfer operation according to an embodiment of the present invention.

Referring to FIG. 6, equalize signals EQ, EQ0 and EQ1 are all at an H level and amplify activation signals SE0 and SE1 are at an L level prior to data transfer. Amplifiers 10 and 11 are both at an inactive state.

It is assumed that even-numbered address data Even and then odd-numbered address data Odd are continuously transferred alternately to complementary data bus pair DB, DB#.

First, equalize signals EQ and EQ0 are driven to an L level. Even-numbered address data Even is transmitted onto complementary data bus pair DB, DB# by driver 30.

The data on complementary data bus pair DB, DB# (the charge stored in capacitive elements C01 and C02) are amplified differentially by amplifier 10. Nodes P11 and P12 of amplifier 11 both maintain the level of the ground potential.

Then, equalize signal EQ0 is driven to an H level whereas equalize signal EQ1 is driven to an L level. Odd-numbered address data Odd is transmitted to complementary data bus pair DB, DB# by transistor 31.

The data on complementary data bus pair DB, DB# (the charge stored in capacitive elements C11 and C12) are amplified differentially by amplifier 11. Nodes P01 and P02 of amplifier 10 are at the level of the ground potential.

Then, equalize signals EQ1 and EQ are driven back to the H level for the subsequent read operation/write operation.

The operation of semiconductor memory device 1000 configured as described above is simulated as shown in FIG. 7. It is assumed that the power supply voltage is 2.5 V and the temperature 27° C.

Figure 7:
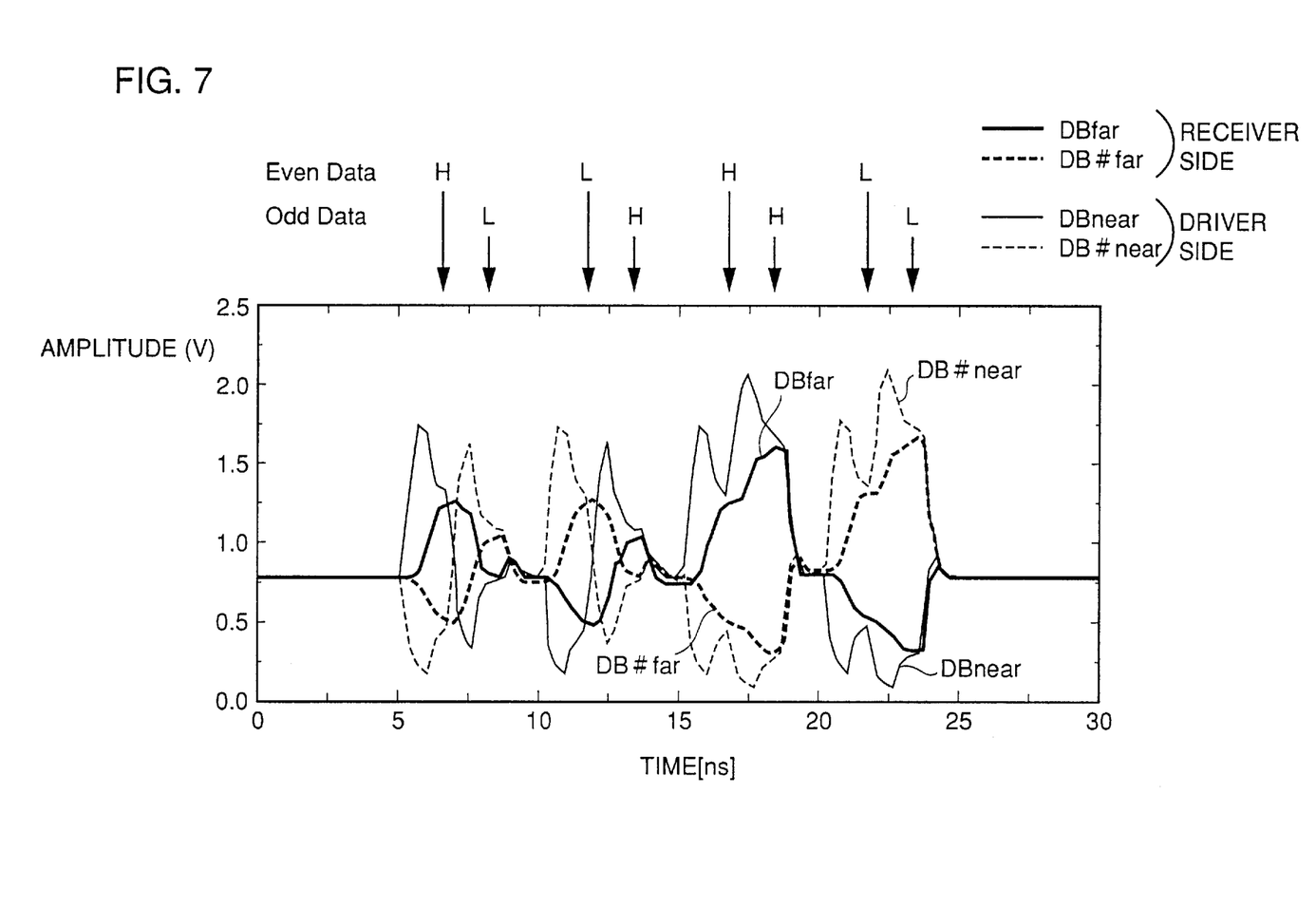
FIG. 7 shows the simulated result of the operation of semiconductor memory device 1000.

In FIG. 7, the time is plotted along the abscissa whereas the amplitude (volt) on the data bus is plotted along the ordinate. EvenData represents even-numbered address data whereas OddData represents odd-numbered address data.

The four sets of data set forth in the following are applied to complementary data bus pair DB, DB#. First, even-numbered address data of an H level is transmitted, followed by transmission of odd-numbered address data of an L level without an equalize period (5 nanoseconds ~). Secondly, even-numbered address data of an L level is transmitted, followed by transmission of odd-numbered address data of an H level without an equalize period (10 nanoseconds ~). Thirdly, even-numbered address data of an H level is transmitted, followed by transmission of odd-numbered address data of an H level without an equalize period (15 nanoseconds ~). Fourthly, even-numbered address data of an L level is transmitted, followed by transmission of odd-numbered address data of an L level without an equalize period (20 nanoseconds ~).

Following respective transmissions of first, second and third data patterns, equalize signals EQ, EQ0 and EQ1 are temporarily set to an inactive state.

In FIG. 7, DBnear represents the simulated result of the potential change on data base DB located in the proximity of driver unit 55 whereas DB#near represents the simulated result of the potential change on data bus DB# located in the proximity of driver unit 55.

DBfar in FIG. 7 represents the simulated result of the potential change on data bus DB located in the proximity of the receivers (20, 21), i.e. the potential change in the proximity of the capacitive couple node (nodes P01, P02, P11 and P12). DB#far represents the simulated result of the potential change on data bus DB# located in the proximity of the receivers (20, 21), i.e., the potential change in the proximity of the capacitive couple nodes (nodes P01, P02, P11 and P12).

It is appreciated that the amplitude value of the data applied to the receiver side (particularly, data corresponding to odd-numbered address data Odd) varies according to the applied data pattern. As to the pattern where even-numbered address data Even is at an H level and odd-numbered address data Odd is at an L level and the pattern where even-numbered address data Even is at an L level and odd-numbered address data Odd is at an H level, the potential change on the data bus in the transmission of odd-numbered address data is slightly smaller. However, the amplitude value of the data is at least 250 mV even in such a case. This is a level of a potential that allows sufficient reading even with a conventional amplifier. This means that a normal operation is ensured.

It is also appreciated that the data buses are equalized to below 1 V (the threshold voltage level by the diode) in an operation other than the data readout operation.

Semiconductor memory device 1000 of the present invention is dispensable of an equalize period during each data transfer in contrast to a conventional one even in the case where data is transferred continuously using a pair of complementary data buses. Therefore, high speed data transfer can be realized. Furthermore, data of a sufficient amplitude value can be received at the receiver side.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a memory cell array including a plurality of memory cells;
   a data bus pair including a first data bus and a second data bus transmitting data complementary to each other;
   a readout circuit reading out n (n is an integer of at least 2) storage data out of a plurality of storage data continuously to said data bus pair in a data readout operation;
   a plurality of output circuits provided corresponding to said n storage data, respectively, each output circuit sensing potential difference between said first data bus and said second data bus to amplify said sensed potential difference; and
   a data transfer processing circuit arranged between said data bus pair and said plurality of output circuits to cause said plurality of output circuits to continuously receive corresponding storage data.

2. The semiconductor device according to claim 1, wherein each of said plurality of output circuits comprises a circuit amplifying potential difference between a first node whose voltage level changes according to a potential of said first data bus and a second node whose voltage level changes according to a potential of said second data bus,
   wherein said data transfer processing circuit comprises
   a plurality of first capacitive elements arranged corresponding to said plurality of output circuits, respectively, each first capacitive element connected between said first data bus and a corresponding first node,
   a plurality of second capacitive elements arranged corresponding to said plurality of output circuits, respectively, each second capacitive element connected between said second data bus and a corresponding second node,
   a plurality of equalize circuits provided corresponding to said plurality of output circuits, respectively, each equalize circuit connected between the corresponding first node and the corresponding second node,
   wherein said plurality of equalize circuits equalize the corresponding first node and the corresponding second node continuously and alternately.

3. The semiconductor device according to claim 2, wherein an equalize operation of a corresponding equalize circuit is suppressed when one of said plurality of output circuits carries out said amplify differentially.

4. The semiconductor device according to claim 1, wherein said plurality of output circuits receives said corresponding storage data without a period in which said first and second data buses are fixed to a predetermined potential during said data readout operation.

5. A semiconductor device comprising:
   a memory cell array including a plurality of memory cells;
   a data bus pair including a first data bus and a second data bus transmitting data complementary to each other;
   a readout circuit reading out two storage data out of a plurality of storage data stored in said plurality of memory cells and providing said two storage data continuously to said data bus pair in a data readout operation;
   a bus equalize circuit provided between said first data bus and said second data bus and inactivated for a period in which said two storage data are continuously provided to said first data bus and said second data bus;
   first and second output circuits provided corresponding to said two storage data, respectively, each including first and second nodes and amplifying potential difference between said first node and second node to output the corresponding storage data; and
   a data transfer processing circuit provided for each of said first and second output circuits, each including an equalize circuit provided between corresponding first node and corresponding second node,
   each said equalize circuit is sequentially inactivated for a predetermined period during the period in which said bus equalize circuit is inactivated.

6. The semiconductor device according to claim 5, wherein said data transfer processing circuit further includes a first capacitor electrically connected between said first data bus and said corresponding first node, and
   a second capacitor electrically connected between said second data bus and said corresponding second node.

* * * * *